(12) United States Patent
Li et al.

(10) Patent No.: US 11,101,437 B2
(45) Date of Patent: Aug. 24, 2021

(54) DISPLAY SUBSTRATE MOTHERBOARD, DISPLAY SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Zeyu Li, Beijing (CN); Ting Wang, Beijing (CN); Qilin Lei, Beijing (CN); Zhiliang Jiang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 94 days.

(21) Appl. No.: 16/399,824

(22) Filed: Apr. 30, 2019

(65) Prior Publication Data
US 2019/0341567 A1    Nov. 7, 2019

(30) Foreign Application Priority Data

May 2, 2018  (CN) .......................... 201810411513.X

(51) Int. Cl.
*B32B 3/12*        (2006.01)
*H01L 51/00*       (2006.01)
(Continued)

(52) U.S. Cl.
CPC ............ *H01L 51/0097* (2013.01); *B32B 3/12* (2013.01); *G02F 1/133305* (2013.01); *G09F 9/301* (2013.01)

(58) Field of Classification Search
CPC ..... B32B 3/12; G02F 1/133305; G09F 9/301; H01L 2251/566; H01L 27/3244; H01L 51/0096; H01L 51/0097; Y02E 10/549
See application file for complete search history.

(56) References Cited

U.S. PATENT DOCUMENTS

2015/0022430 A1  1/2015  Namkung
2016/0233248 A1  8/2016  Kwak et al.
(Continued)

FOREIGN PATENT DOCUMENTS

CN    105870147 A    8/2016
CN    205609526 U    9/2016
(Continued)

OTHER PUBLICATIONS

First Office Action issued in corresponding Chinese Application No. 201810411513.X, dated Sep. 1, 2020, with English language translation.

*Primary Examiner* — Lawrence D Ferguson
(74) *Attorney, Agent, or Firm* — McDermott Will and Emery LLP

(57) ABSTRACT

A display substrate motherboard has at least one display region and a peripheral region disposed at a periphery of the at least one display region, and the peripheral region includes cutting regions. The display substrate motherboard includes a base substrate and at least one inorganic film layer disposed on a side of the base substrate. Each inorganic film layer includes at least one first opening located in each cutting region. The display substrate motherboard further includes a first organic material filled in each first opening.

13 Claims, 7 Drawing Sheets

(51) Int. Cl.
*G02F 1/1333* (2006.01)
*G09F 9/30* (2006.01)

(56) References Cited

U.S. PATENT DOCUMENTS

2016/0254464 A1* 9/2016 Hsieh .................. H01L 51/0097
428/192
2019/0131569 A1 5/2019 Ma et al.
2019/0181362 A1 6/2019 Tian et al.

FOREIGN PATENT DOCUMENTS

| CN | 107742476 A | 2/2018 |
| CN | 107785505 A | 3/2018 |
| CN | 107910296 A | 4/2018 |

* cited by examiner

DISPLAY SUBSTRATE MOTHERBOARD, DISPLAY SUBSTRATE AND DISPLAY DEVICE

CROSS-REFERENCE TO RELATED APPLICATION

This application claims priority to Chinese Patent Application No. 201810411513.X, filed with the Chinese Patent Office on May 2, 2018, titled "DISPLAY SUBSTRATE MOTHERBOARD, DISPLAY SUBSTRATE AND DISPLAY DEVICE", which is incorporated herein by reference in its entirety.

TECHNICAL FIELD

The present disclosure relates to the field of display technologies, and in particular, to a display substrate motherboard, a display substrate and a display device.

BACKGROUND

In a process of manufacturing a display substrate, a display substrate motherboard is formed first, and then the display substrate motherboard is cut into at least one display substrate.

SUMMARY

In a first aspect, a display substrate motherboard is provided. The display substrate motherboard has at least one display region and a peripheral region disposed at a periphery of the at least one display region, and the peripheral region includes cutting regions. The display substrate motherboard includes a base substrate and at least one inorganic film layer disposed on a side of the base substrate. Each inorganic film layer includes at least one first opening located in each cutting region, and the display substrate motherboard further includes a first organic material filed in each first opening.

In some embodiments, the display substrate motherboard further includes a first organic film layer disposed on a side of the at least one inorganic film layer facing away from the base substrate. The organic material filled in each first opening is a portion of the first organic film layer located in the first opening.

In some embodiments, the peripheral region further includes at least one non-cutting region. A portion of each inorganic film layer located in each non-cutting region includes at least one slit, and the display substrate motherboard further includes a second organic material filled in each slit.

In some embodiments, the at least one first opening of each inorganic film layer located in each cutting region includes a plurality of first openings, and each first opening is a strip-shaped opening. In some other embodiments, the at least one first opening of each inorganic film layer located in each cutting region includes a single first opening, and an orthographic projection of the first opening on the base substrate coincides with an orthographic projection of the cutting region on the base substrate.

In some embodiments, wherein the at least one inorganic film layer includes a plurality of inorganic film layers, and first openings of the plurality of inorganic film layers located in a same region communicate with one another in a direction perpendicular to the base substrate.

In some embodiments, the base substrate includes at least one flexible base, and each flexible base includes an organic material layer and a barrier layer disposed on a side of the organic material layer adjacent to the at least one inorganic film layer. A portion of each barrier layer of the at least one flexible base located in each cutting region includes at least one second opening, and the display substrate motherboard further includes a third organic material filled in each second opening.

In some embodiments, wherein the at least one flexible base includes N flexible bases stacked on top of one another, N is greater than or equal to 2, and N is an integer. A (n+1)th flexible base is disposed on a side of a nth flexible base adjacent to the at least one inorganic film layer, n is greater than or equal to 1 and is less than or equal to (N−1), and n is an integer. The third organic material filled in each second opening of the nth flexible base is a portion of an organic material layer of the (n+1)th flexible base located in the second opening of the nth flexible base.

In some embodiments, the at least one flexible base includes N flexible bases stacked on top of one another, N is greater than or equal to 2, and N is an integer. The display substrate motherboard further includes a second organic film layer disposed on a side of a Nth flexible base adjacent to the at least one inorganic film layer; and the third organic material filled in each second opening of the Nth flexible base is a portion of the second organic film layer located in the second opening of the Nth flexible base.

In a second aspect, a display substrate is provided. The display substrate includes a display region and a non-display region disposed at a periphery of the display region, and the non-display region includes edge regions. The display substrate includes a base substrate and at least one inorganic film layer disposed on a side of the base substrate. Each inorganic film includes at least one inorganic film removal region located in each edge region, and the display substrate further includes a first organic material filed in each inorganic film removal region.

In some embodiments, the display substrate further includes a first organic film layer disposed on a side of the at least one inorganic film layer facing away from the base substrate. The first organic material filled in each inorganic film removal region is a portion of the first organic film located in the inorganic film removal region.

In some embodiments, the non-display region further includes a non-edge region, a portion of each inorganic film located in the non-edge region includes at least one slit, and the display substrate further includes a fourth organic material filed in each slit.

In some embodiments, the at least one inorganic film removal region of each inorganic film in each edge region includes a plurality of inorganic film removal regions, and each inorganic film removal region is disposed in a strip shape. Alternatively, the at least one inorganic film removal region of each inorganic film in each edge region includes a single inorganic film removal region, and an orthographic projection of the inorganic film removal region on the base sub-substrate coincides with an orthographic projection of the edge region on the base sub-substrate.

In some embodiments, the at least one inorganic film includes a plurality of inorganic films, and inorganic film removal regions of the plurality of inorganic films located in a region communicate with one another in a direction perpendicular to the base sub-substrate.

In some embodiments, the base sub-substrate includes at least one flexible sub-base, and each flexible sub-base includes an organic material film and a barrier film disposed on a side of the organic material film adjacent to the at least one inorganic film. A portion of each barrier film of the at least one flexible sub-base located in each edge region includes at least one third opening, and the display substrate further includes a fifth organic material filled in each third opening.

In some embodiments, the at least one flexible sub-base includes N flexible sub-bases stacked on top of one another, N is greater than or equal to 2, and N is an integer. A (n+1)th flexible sub-base is disposed on a side of a nth flexible sub-base adjacent to the at least one inorganic film, n is greater than or equal to 1 and is less than or equal to (N−1), and n is an integer. The fifth organic material filled in each third opening of the nth flexible sub-base is a portion of an organic material film of the (n+1)th flexible sub-base located in the third opening of the nth flexible sub-base.

In some embodiments, the at least one flexible sub-base includes N flexible sub-bases stacked on top of one another, N is greater than or equal to 2, and N is an integer. The display substrate further includes a second organic film disposed on a side of a Nth flexible sub-base adjacent to the at least one inorganic film; and the fifth organic material filled in each third opening of the Nth flexible sub-base is a portion of the second organic film located in the third opening of the Nth flexible sub-base.

In a third aspect, a display device is provided. The display device includes the display substrate according to the second aspect.

BRIEF DESCRIPTION OF THE DRAWINGS

In order to describe technical solutions in embodiments of the present disclosure more clearly, the accompanying drawings to be used in the description of disclosure will be introduced briefly. Obviously, the accompanying drawings to be described below are merely some embodiments of the present disclosure, and a person of ordinary skill in the art can obtain other drawings according to these drawings without paying any creative effort.

DETAILED DESCRIPTION

The technical solutions in some embodiments of the present disclosure will be described clearly and completely with reference to the accompanying drawings in some embodiments of the present disclosure. Obviously, the described embodiments are merely some but not all of embodiments of the present disclosure. All other embodiments made on the basis of the embodiments of the present disclosure by a person of ordinary skill in the art without paying any creative effort shall be included in the protection scope of the present disclosure.

Hereinafter, "a plurality of" means two or more than two unless otherwise specified. Terms "first", "second" and "third" are used to distinguish between same or similar items whose functions and effects are substantially the same. A person skilled in the art will understand that the terms "first", "second" and "third" are not intended to limit a quantity and order of execution of the items, and do not limit a difference among the items.

Figure 1:
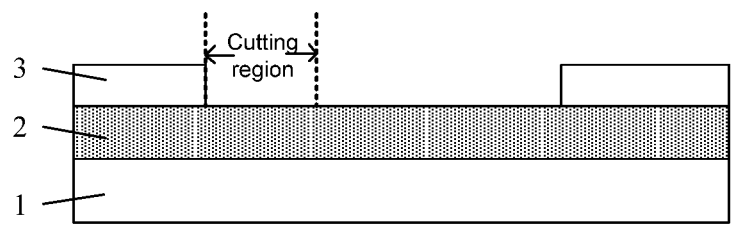
FIG. 1 is a schematic diagram showing a structure of a display substrate motherboard in the related art.

As shown in FIG. 1, a display substrate motherboard includes an organic film layer 3 disposed at a side of a base substrate 1, and an inorganic film layer 2 disposed between the base substrate 1 and the organic film layer 3. In a process of cutting the display substrate motherboard into display substrates, edge cracks of a portion of the inorganic film layer 2 included in each display substrate are easily caused due to an impact of an external force applied on the a portion of the inorganic film layer 2 located in the cutting region. Moreover, a cutting surface of the portion of the inorganic film layer 2 included in the display substrate is exposed, and thus edge cracks of the portion are also caused in a case where the exposed surface is subjected to an external force such as collision, pressing, and bending or the like. Therefore, once the edge cracks of the portion of the inorganic film layer 2 included in the display substrate extend to a display region of the display substrate, a failure of an encapsulation of the display substrate is easily caused, thereby affecting a service life of the display substrate.

Figure 2:
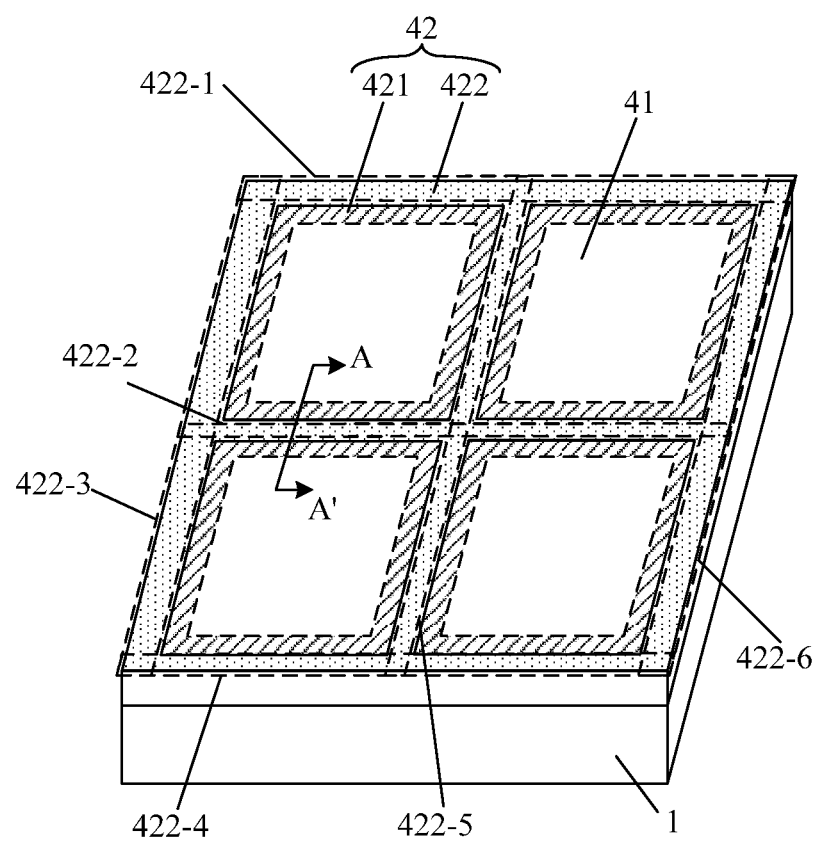
FIG. 2 is a schematic diagram showing a three-dimensional structure of a display substrate motherboard, in accordance with some embodiments.
Figure 3:
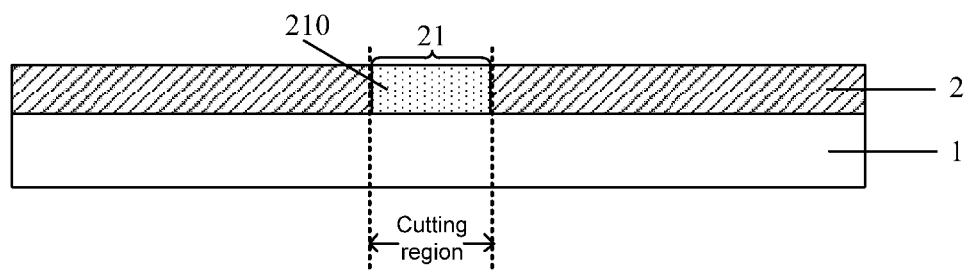
FIG. 3 is a cross-section diagram of a display substrate motherboard taken along line A-A' shown in FIG. 2, in accordance with some embodiments.
Figure 4:
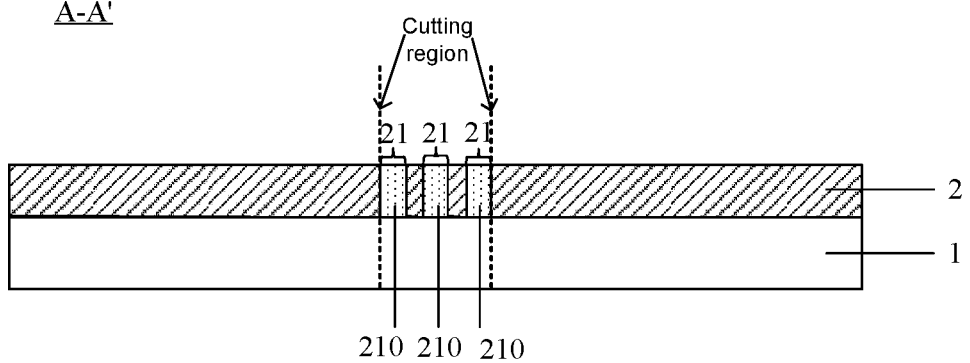
FIG. 4 is a cross-section diagram of another display substrate motherboard taken along line A-A' shown in FIG. 2, in accordance with some embodiments.

Based on this, some embodiments of the present disclosure provide a display substrate motherboard. As shown in FIGS. 2 and 3, the display substrate motherboard has at least one display region 41 and a peripheral region 42 disposed at a periphery of the at least one display region 41, and the peripheral region 42 includes cutting regions 422 and at least one non-cutting region 421. The display substrate motherboard includes a base substrate 1 and at least one inorganic film layer 2 disposed on a side of the base substrate 1. As shown in FIGS. 3 and 4, each inorganic film layer 2 includes at least one opening 21 formed in a portion of the inorganic film layer 2 that is located in each cutting region 422. The display substrate motherboard further includes a first organic material 210 filled in each first opening 21.

It will be noted that the cutting regions 422 refer to regions in which the display substrate motherboard may be cut during the process of cutting the display substrate motherboard into the at least one display substrate. That is, the cutting lines along which the display substrate motherboard is cut are located in the cutting regions respectively. For example, as shown in FIG. 2, the display substrate motherboard has six cutting regions, i.e., 422-1, 422-2, 422-3, 422-4, 422-5, and 422-6, respectively. The cutting regions 422-1, 422-3, 422-4, and 422-6 are disposed at the edges of the display substrate motherboard respectively. The cutting region 422-2 is disposed between two upper display regions 41 and two lower display regions 41. The cutting region 422-5 is disposed between two left display regions 41 and two right display regions 41. The at least one non-cutting region 421 is at least one region other than the cutting regions 422 in the peripheral region 42. Moreover, the cutting regions 422 and the at least one non-cutting region 421 are all located in the peripheral region 42, the cutting regions 422 are located at peripheries of the at least one non-cutting region 421, and the non-cutting region 421 includes, for example, wiring areas of the display substrate motherboard. Each non-cutting region 421 corresponds to a display region 41.

When the display substrate motherboard is cut along cutting lines, the cutting may be performed on first openings 21 of the at least one inorganic film layer 2 filled with the first organic material 210.

In some examples, as shown in FIG. 3, the at least one first opening 21 of each inorganic film layer 2 located in each cutting region 422 includes a single first opening 21. For example, an orthographic projection of the first opening 21 on the base substrate 1 is located within an orthographic projection of the cutting region 422 on the base substrate 1. For another example, the orthographic projection of the first opening 21 on the base substrate 1 coincides with the orthographic projection of the cutting region 422 on the base substrate 1. In this way, the first opening 21 filled with the first organic material 210 occupies the entire cutting region 422, which may reduce or eliminate a portion of the inorganic film layer 2 in the cutting portion 422, and thus brittleness of the portion of the inorganic film layer 2 in the cutting region 422 may be reduced, thereby making it easier to cut the display substrate motherboard.

In some other examples, as shown in FIG. 4, the at least one first opening 21 of each inorganic film layer 2 located in each cutting region 422 includes a plurality of first openings 21. For example, each first opening 21 is a strip-shaped opening, and a length direction of the strip-shaped opening is the same as a cutting direction, which is advantageous for reducing or eliminating the portion of the inorganic film layer 2 in the cutting region, thereby making it easier to cut the display substrate motherboard. Moreover, a use of strip-shaped openings in the inorganic film layer 2 and the first organic material 210 filled in each strip-shaped opening may also prevent heat from accumulating in the cutting region 422 due to a cutting action, and may effectively lower a temperature of the cutting region 422, thereby preventing the first organic material 210 in a corresponding region from being carbonized due to an excessive temperature.

In some embodiments, the at least one inorganic film layer 2 is formed only in the peripheral region 42, or is simultaneously formed in the peripheral region 42 and the at least one display region 41. Some embodiments of the present disclosure do not limit types of a material of the inorganic film layer 2 and the first organic material 210 filled in each first opening 21, as long as an impact toughness of the first organic material 210 is greater than an impact toughness of the material of the inorganic film layer 2. For examples, the material of the at least one inorganic film layer 2 includes at least one of SiNx or SiOx, and the first organic material 210 is polyimide (abbreviated as PI).

Some embodiments of the present disclosure do not limit a structure of the display substrate motherboard, as long as the display substrate obtained by cutting the display substrate motherboard can be used for display. For example, the display substrate motherboard is an organic light-emitting diode (abbreviated as OLED) display substrate motherboard that is configured to form at least one OLED display substrate, or is a liquid crystal display (abbreviated as LCD) display substrate motherboard that is configured to form at least one LCD display substrate.

In some examples, the display substrate motherboard is an OLED display substrate motherboard, and the at least one inorganic film layer 2 includes at least one of a buffer layer, a gate insulating layer or an interlayer insulating layer. In addition, the OLED display substrate motherboard further includes a pixel array disposed in each display region 41, and each pixel of the pixel array includes a light-emitting device and a pixel circuit coupled to the light-emitting device. Each pixel circuit includes at least one thin film transistor (TFT), and is configured to drive a corresponding light-emitting device to emit light. Each light-emitting device includes an anode and a cathode disposed opposite to each other, and a light-emitting functional layer disposed between the anode and the cathode.

In some other examples, the display substrate motherboard is a LCD display substrate motherboard, and the at least one inorganic film layer 2 includes at least one of a buffer layer or a gate insulating layer or the like. In addition, the LCD display substrate motherboard further includes a pixel array disposed in each display region 41, and each pixel of the pixel array includes a common electrode, a pixel electrode and a pixel circuit coupled to the pixel electrode. Each pixel circuit includes at least one thin film transistor (TFT) and at least one capacitor.

In the display substrate motherboard provided by the embodiments of the present disclosure, a portion of each inorganic film layer 2 located in each cutting region 422 is provided with at least one first opening 21, and each first opening 21 is filled with the first organic material 210. As a result, when the display substrate motherboard is cut along a cutting line in any cutting region 422, since the first organic material 210 has a higher impact toughness than the inorganic film layer 2, the use of the first organic material 210 filled in each first opening 21 may effectively reduce a cutting force received by the inorganic film layer 2 or prevent the inorganic film layer 2 from being impacted by the cutting force, thereby avoiding the edge cracks of a portion of the inorganic film layer 2 in the cutting region 422. Of course, in the display substrate obtained by cutting the display substrate motherboard, since an edge portion of the display substrate adjacent to the cutting surface includes the first organic material 210, through a protective effect of the first organic material 210 in the edge portion of the display substrate, the edge cracks of the portion of the inorganic film layer 2 corresponding to the edge region of the display substrate due to the external force such as collision, pressing, bending or the like may be prevented, thereby avoiding a problem of crack extension of the portion of the inorganic film layer 2 corresponding to the display substrate and facilitating increasing the service life of the display substrate.

Figure 5:
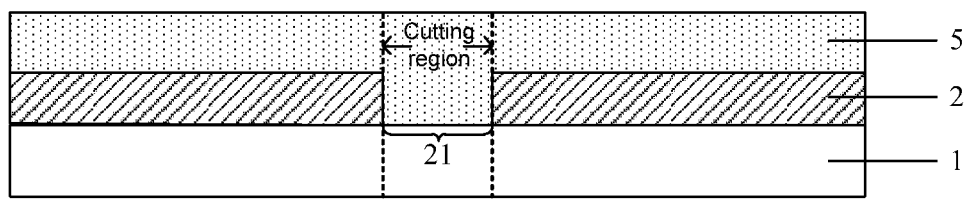
FIG. 5 is a cross-section diagram of yet another display substrate motherboard taken along line A-A' shown in FIG. 2, in accordance with some embodiments.

In some embodiments, as shown in FIG. 5, the display substrate motherboard further includes a first organic film layer 5 disposed on a side of the at least one inorganic film layer 2 facing away from the base substrate 1. The first organic material 210 filled in each first opening 21 is a portion of the first organic film layer 5 located in the first opening 21. That is, when the first organic film layer 5 is formed on the side of the at least one inorganic film layer 2 facing away from the base substrate 1, the organic material for forming the first organic film layer 5 may also be used for filling each first opening 21 while the first organic film layer 5 is formed. In addition, the first organic film layer 5 covers a part of a surface of the inorganic film layer 2 facing away from the base substrate 1, thereby protecting the inorganic film layer 2.

It will be noted that an impact toughness of a material of the first organic film layer 5 is greater than the impact toughness of the material of the at least one inorganic film layer 2. For example, the first organic film layer 5 is made of PI.

In these embodiments, a part of the material for forming the first organic film layer 5 disposed on the surface of the at least one inorganic film layer 2 facing away from the base substrate 1 may be used for filling each first opening 21 in the at least one inorganic film layer 2, thereby eliminating a need to separately fill each first opening 21 in the at least one inorganic film layer 2 with the first organic material 210, and simplifying a process of manufacturing the display substrate motherboard.

Figure 6:
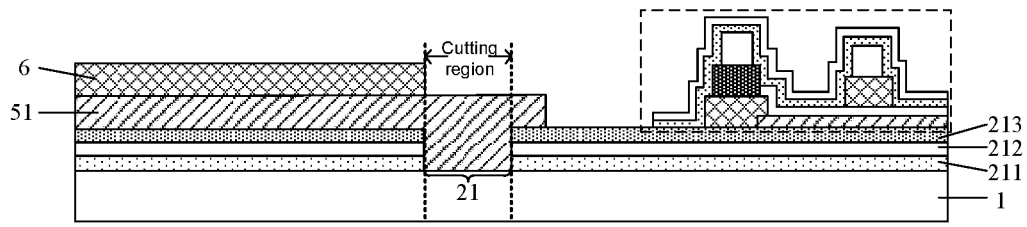
FIG. 6 is a cross-section diagram of yet another display substrate motherboard taken along line A-A' shown in FIG. 2, in accordance with some embodiments.

In some embodiments, as shown in FIG. 6, the display substrate motherboard is an OLED display substrate motherboard. The OLED display substrate motherboard includes a buffer layer 211, a gate insulating layer 212, an interlayer insulating layer 213 and a planarization (abbreviated as PLN) layer 51 that are disposed on the base substrate 1 in sequence. Materials of the buffer layer 211, the gate insulating layer 212 and the interlayer insulating layer 213 include at least one of SiNx or SiOx (or a similar inorganic material), and the planarization layer 51 is made of an organic material. That is, the at least one inorganic film layer 2 includes the buffer layer 211, the gate insulating layer 212 and the interlayer insulating layer 213, and the planarization layer 51 is the first organic film layer 5 in the embodiments described above. With continued reference to FIG. 6, portions of the buffer layer 211, the gate insulating layer 212 and the interlayer insulating layer 213 located in each cutting region 422 are all removed to form first openings 21. That is, first openings 21 communicating with one another are formed in each cutting region 422, and the first openings 21 are filled with a portion of the planarization layer 51 located in the cutting region 422.

In some embodiments, with reference to FIGS. 3, 4 and 6, the at least one inorganic film layer 2 includes a plurality of inorganic film layers 2 (such as the buffer layer 211, the gate insulating layer 212 and the interlayer insulating layer 213), and a portion of each inorganic film layer 2 located in each cutting region 422 is provided with at least one first opening 21. Openings 21 of the plurality of inorganic film layers 2 located in a same region communicates with one another in a direction perpendicular to the base substrate 1. That is, when the plurality of inorganic film layers 2 are as a whole, the openings 21 located in a same region communicates with one another and pass through the plurality of inorganic film layers.

It will be noted that in a case where the at least one inorganic film layer 2 includes the plurality of inorganic film layers 2, the plurality of inorganic film layers 2 are stacked on top of one another, and each adjacent two inorganic film layers are in direct contact or spaced apart, which some embodiments of the present disclosure do not limit.

In some embodiments, each adjacent two inorganic film layers 2 are in direct contact, and first openings 21 in at least two inorganic film layers 2 are disposed in a same manner. That is, an orthographic projection of each first opening 21 in an inorganic film layer 2 on the base substrate 1 overlaps with an orthographic projection of a corresponding first opening 21 in an adjacent inorganic film layer 2 on the base substrate 1. In this way, the first openings 21 may be formed in at least two inorganic film layers 2 through a same patterning process, which is advantageous for simplifying the process of manufacturing the display substrate motherboard.

In these embodiments, a portion of each inorganic film layer 2 located in a cutting region 422 is provided with at least one first opening 21, and each first opening 21 is filled with the first organic material 210, which may prevent the edge cracks of the portion of any inorganic film layer 2 due to the cutting.

Figure 7:
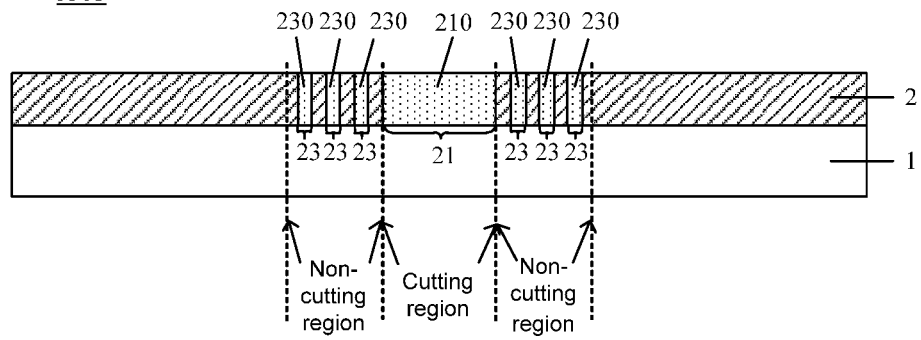
FIG. 7 is a cross-section diagram of yet another display substrate motherboard taken along line A-A' shown in FIG. 2, in accordance with some embodiments.

In some embodiments, as shown in FIG. 7, a portion of each inorganic film layer 2 located in each non-cutting region 421 includes at least one slit 23, and the display substrate motherboard further includes a second organic material 230 filled in each slit 23. In some examples, as shown in FIGS. 2 and 7, each non-cutting region 421 circles a display region 41, each slit 23 located in the non-cutting region 421 circles the display region 41, that is, each slit 23 is in an annular rectangular shape. For example, as shown in FIGS. 2 and 7, each slit 23 includes four strip-shaped slits connected in sequence. In some examples, the at least one slit 23 of each inorganic film layer 2 located in each non-cutting region 421 includes a single slit 23. In some other examples, the at least one slit 23 of each inorganic film layer 2 located in each non-cutting region 421 includes a plurality of slits 23, and a outer slit 23 of the plurality of slits 23 surrounds a inner slit 23 of the plurality of slits 23. In some other examples, each of at least one slit 23 of the plurality of slits is filled with the second organic material 230. It will be noted that the shape of the slit 23 will not be limited to the annular rectangular shape, and can be set according to actual needs. For example, the slit 23 is in a semi-annular shape.

Since the impact toughness of the second organic material 230 is relatively high, the inorganic film layer 2 in the display substrate motherboard may be further protected by filling the second organic material 230 in each slit 23 in each non-cutting region 421. That is, the second organic material 230 filled in each slit 23 cooperates with the first organic material 210 filled in each first opening 21, which may prevent the edge cracks of a portion of the inorganic film layer 2 due to the impact of the cutting force, and may also effectively prevent the edge cracks of the portion of the inorganic film layer 2 from extending to the display regions 41 in a case of the edge cracks of the portion of the inorganic film layer 2.

In addition, a portion of each inorganic film layer 2 located in each non-cutting region 421 is provided with at least one slit 23, and the second organic material 230 is filled in each strip-shaped slit 23, which may be used for preventing heat from accumulating in the non-cutting region 421 due to a cutting action of an adjacent cutting region 422, thereby lowering a temperature of the non-cutting region 421, and effectively preventing the second organic material 230 in a corresponding region from being carbonized due to an excessive temperature.

In some examples, the second organic material 230 and the first organic material 210 are the same material.

Figure 8:
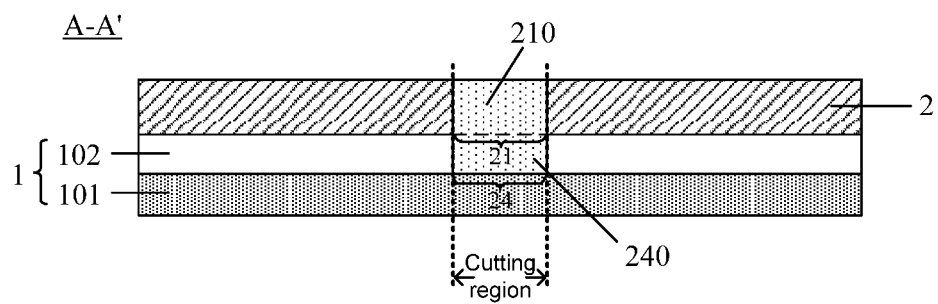
FIG. 8 is a cross-section diagram of yet another display substrate motherboard taken along line A-A' shown in FIG. 2, in accordance with some embodiments.
Figure 9:
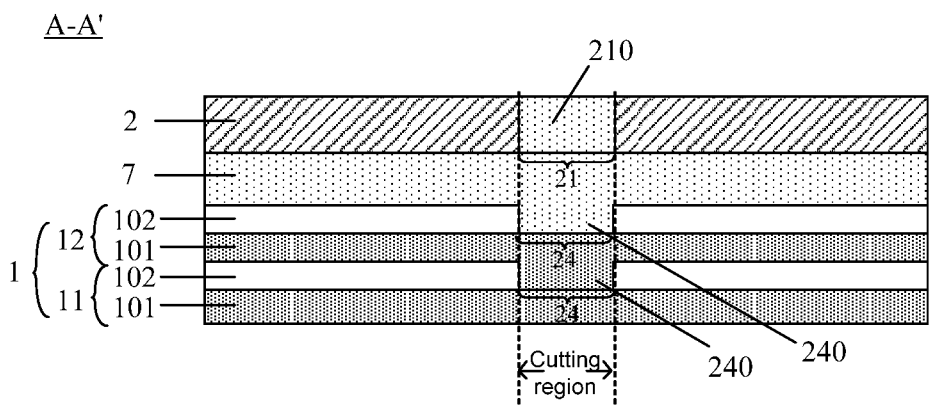
FIG. 9 is a cross-section diagram of yet another display substrate motherboard taken along line A-A' shown in FIG. 2, in accordance with some embodiments.

In some embodiments, with reference to FIGS. 8 and 9, the base substrate 1 includes at least one flexible base, and each flexible base includes an organic material layer 101 and a barrier layer 102 disposed on a surface of the organic material layer 101 adjacent to the at least one inorganic film layer 2. A portion of each barrier layer 102 of the at least one flexible base located in each cutting region 422 is provided with at least one second opening 24, and the display substrate motherboard further includes a third organic material 240 filed in each second opening 24. The setting of the at least one second opening 24 may refer to the setting of the at least one first opening 21, which will not repeated herein.

For example, the organic material layer 101 is made of an organic material such as PI, and the barrier layer 102 is made of an inorganic material such as SiOx. In this way, edge cracks of a portion of the base substrate 1 corresponding to the display substrate due to the cutting may be effectively prevented.

In some embodiments, with reference to FIG. 9, the at least one flexible base includes N flexible bases stacked on top of one another, N is greater than or equal to 2, and N is an integer. A (n+1)th flexible base is disposed on a surface of a nth flexible base adjacent to the at least one inorganic film layer 2, n is greater than or equal to 1 and is less than or equal to (N−1), and n is an integer. The third organic material 240 filled in each second opening 24 of the nth flexible base is a portion of an organic material layer 101 of the (n+1)th flexible base that is located in the second opening 24 of the nth flexible base.

In some embodiments, with continued reference to FIG. 9, the display substrate motherboard further includes a second organic film layer 7 disposed between a Nth flexible base and the at least one inorganic film layer 2. The third organic material 240 filled in each second opening 24 of the Nth flexible base is a portion of the second organic film layer 7 that is located in the second opening 24 of the Nth flexible base.

For example, as shown in FIG. 9, the base substrate 1 includes two flexible bases stacked on top of one another, which are a first flexible base 11 and a second flexible base 12, respectively. The second flexible base 12 is disposed on a surface of the first flexible base 11 adjacent to the at least one inorganic film layer 2. A part of the organic material layer 101 of the second flexible base 12 is filled in second openings 24 of the barrier layer 102 of the first flexible base 11. In a case where the display substrate motherboard further includes the second organic film layer 7 disposed on the surface of the barrier layer 102 of the second flexible base 12 facing away from the first flexible base 11, a part of the second organic film layer 7 is filled in second openings 24 of the barrier layer 102 of the second flexible base 12.

The fact that a part of the organic material layer 101 of the second flexible base 12 is filled in second openings 24 of the barrier layer 102 of the first flexible base 11 described above means that when the organic material layer 101 of the second flexible base 12 is formed on the surface of the barrier layer 102 of the first flexible base 11 facing away from the organic material layer 101 of the first flexible base 11, the organic material for forming the organic material layer 101 of the second flexible base 12 may also be used for filling the second openings 24 of the barrier layer 102 of the first flexible base 11 while the organic material layer 101 of the second flexible base 12 is formed. The fact that a part of the second organic film layer 7 is filled in the second openings 24 of the barrier layer 102 of the second flexible base 12 means that when the second organic film layer 7 is formed on a surface of the barrier layer 102 of the second flexible base 12 facing away from the organic material layer 101 of the second flexible base 12, the organic material for forming the second organic film layer 7 may also be used for filling the second openings 24 of the barrier layer 102 of the second flexible base 12 while the second organic film layer 7 is formed. In this way, the process of manufacturing the display substrate motherboard may be effectively simplified.

In some examples, the second organic film layer 7 is made of an organic material, such as PI. In some examples, the material for fabricating the second organic film layer 7 is the same as or different from the material for fabricating the organic material layer 101 of the second flexible base 12. In some examples, the third organic material 240, the second organic material 230 and the first organic material 210 are the same material.

It will be understood that if the inorganic film layer 2 is directly formed on a surface of the barrier layer 102 of the base substrate 1, the first openings 21 in the inorganic film layer 2 and the second openings 24 in the barrier layer 102 may be disposed in the same manner, for example, as shown in FIG. 8, so that the first openings 21 in the inorganic film layer 2 and the second openings 24 in the barrier layer 102 may be filled with the organic material through a same process. On this basis, if the second organic film layer 7 is provided in the display substrate motherboard, the second organic film layer 7 may be disposed on a surface of the at least one inorganic film layer 2 away from the base substrate 1, so that a part of the material for fabricating the second organic film layer 7 may also be used for filling the second openings 24 in the barrier layer 102 and the first openings 21 in the at least one inorganic film layer 2. That is, the second organic film layer 7 herein has a same function as the first organic film layer 5 in the embodiments described above, and both may be a same organic film layer.

Figure 10:
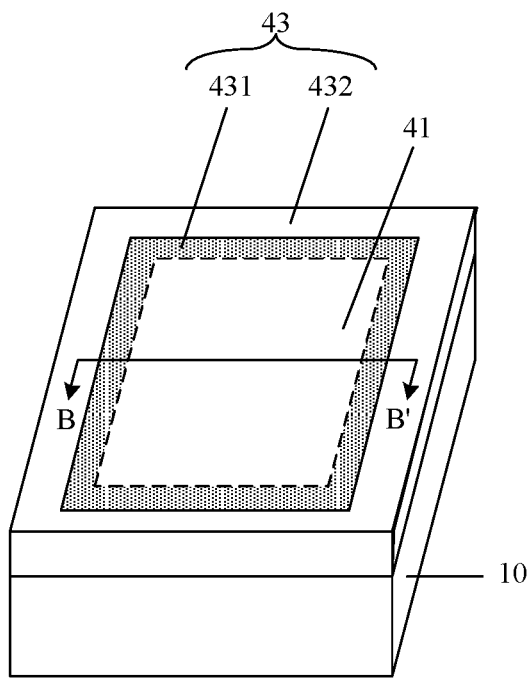
FIG. 10 is a schematic diagram showing a three-dimensional structure of a display substrate, in accordance with some embodiments.
Figure 11:
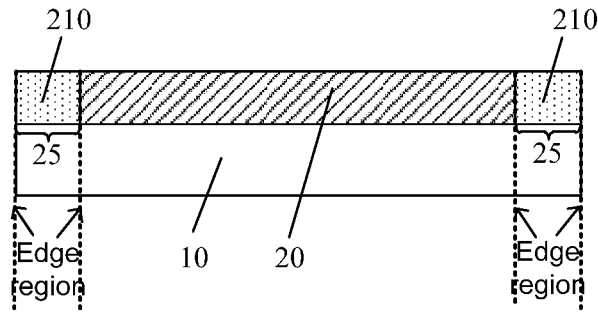
FIG. 11 is a cross-section diagram of a display substrate taken along line B-B' shown in FIG. 10, in accordance with some embodiments.

Some embodiments of the present disclosure provide a display substrate, which is formed by cutting the display substrate motherboard described in some of the above embodiments. As shown in FIGS. 10 and 11, the display substrate has a display region 41 and a non-display region 43 disposed at a periphery of the display region 41, and the non-display region 43 includes edge regions 432 and a non-edge region 431. The display substrate includes a base sub-substrate 10 and at least one inorganic film 20 disposed on a side of the base sub-substrate 10. A portion of each inorganic film 20 located in each edge region 432 includes at least one inorganic film removal region 25. The display substrate further includes the first organic material 210 filled in each inorganic film removal region 25.

It will be noted that the non-display region 43 refers to a region of the display substrate located at a periphery of the display region 41 after forming the display substrate by cutting the display substrate motherboard. The edge regions 432 refer to portions of the non-display region 43 of the display substrate adjacent to the cutting surfaces respectively. For example, as shown in FIG. 10, the edge regions includes four edge regions surrounding the display region 41. The non-edge region 431 refers to a region other than the edge region 432 of the non-display region 43 of the display substrate, and the non-edge region 431 surrounds the display region 41. For example, the non-edge region 431 includes the wiring area of the display substrate. The inorganic film removal region 25 refers to an opening which passes through the inorganic film layer 2 and is located in the edge region 432 after forming the display substrate by cutting the display substrate motherboard.

In some examples, as shown in FIG. 11, the at least one inorganic film removal region 25 of each inorganic film 20 located in each edge region 432 includes a single inorganic film removal region 25. For example, an orthographic projection of the inorganic film removal region 25 on the base sub-substrate 10 is located within an orthographic projection of the edge region 432 on the base sub-substrate 10. For another example, an orthographic projection of the inorganic film removal region 25 on the base sub-substrate 10 coincides with an orthographic projection of the edge region 432 on the base sub-substrate 10. In this way, the inorganic film removal region 25 filled with the first organic material 210 occupies the entire edge region 432, which may protect the edge of the display substrate to prevent the edge cracks of the inorganic film 20 of the display substrate due to the external force such as collision, pressing, bending or the like, thereby avoiding the problem of crack extension in the inorganic film 20 and facilitating increasing the service life of the display substrate.

Figure 12:
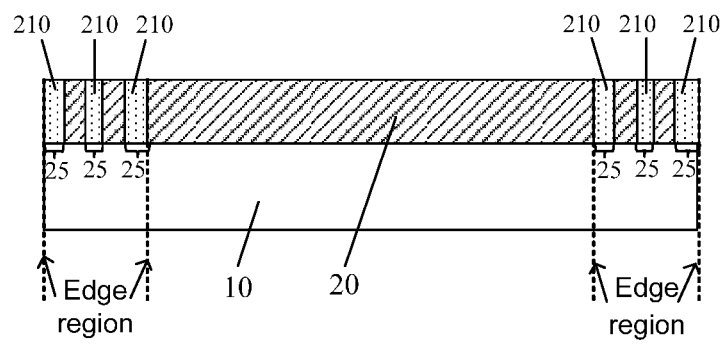
FIG. 12 is a cross-section diagram of another display substrate taken along line B-B' shown in FIG. 10, in accordance with some embodiments.

In some embodiments, as shown in FIG. 12, the at least one inorganic film removal region 25 of each inorganic film 20 located in each edge region 432 includes a plurality of inorganic film removal regions 25, and each inorganic film removal region 25 is disposed in a strip shape. For example, each inorganic film removal region 25 is a strip-shaped opening, or an opening of other shapes, which some embodiments of the present disclosure do not limit.

In some embodiments, the at least one inorganic film 20 is formed only in the non-display region 43, or is simultaneously formed in the non-display region 43 and the display region 41. Some embodiments of the present disclosure do not limit the types of the material of the at least one inorganic film 20 and the first organic material 210 filled in each inorganic film removing region 25, as long as the impact toughness of the first organic material 210 is greater than the impact toughness of the material of the at least one inorganic film 20. For example, the materials of the at least one inorganic film 20 includes at least one of SiNx or SiOx, and the first organic material 210 is polyimide (abbreviated as PI).

In the display substrate provided by the embodiments of the present disclosure, a portion of each inorganic film 20 located in each edge region 432 is provided with at least one inorganic film removing region 25, and each of the at least one inorganic film removing region 25 is filled with the first organic material 210. In this way, the edge of the display substrate may be protected by the first organic material 210, and the edge cracks of the inorganic film 20 of the display substrate due to the external force such as collision, pressing, bending or the like may be prevented, thereby avoiding the problem of crack extension in the inorganic film 20 and facilitating increasing the service life of the display substrate.

Some embodiments of the present disclosure do not limit a structure of the display substrate. For example, the display substrate is an OLED display substrate or a LCD display substrate.

In some embodiments, the display substrate is an OLED display substrate, and the at least one inorganic film 20 includes at least one of a buffer film, a gate insulating film or an interlayer insulating film. In addition, the OLED display substrate includes a pixel array disposed in the display region 41, and each pixel of the pixel array includes a light-emitting device and a pixel circuit coupled to the light-emitting device. Each pixel circuit includes at least one thin film transistor (TFT), and is configured to drive a corresponding light-emitting device to emit light. Each light-emitting device includes an anode and a cathode disposed opposite to each other and a light-emitting functional layer disposed between the anode and the cathode.

In some other embodiments, the display substrate is a LCD display substrate, and the at least one inorganic film 20 includes at least one of a buffer film or a gate insulating film or the like. In addition, the LCD display substrate further includes a pixel array disposed in the display region 41, and each pixel of the pixel array includes a common electrode, a pixel electrode and a pixel circuit coupled to the pixel electrode. Each pixel circuit includes at least one thin film transistor (TFT) and at least one capacitor.

Figure 13:
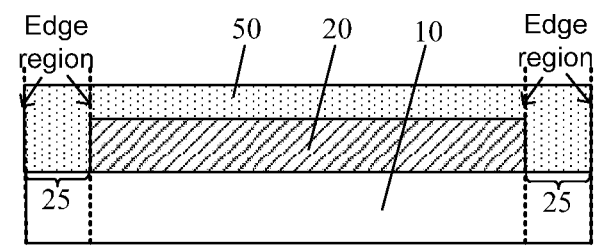
FIG. 13 is a cross-section diagram of yet another display substrate taken along line B-B' shown in FIG. 10, in accordance with some embodiments.

In some embodiments, as shown in FIG. 13, the display substrate further includes a first organic film 50 disposed on a side of the at least one inorganic film 20 facing away from the base sub-substrate 10. The first organic material 210 filled in each inorganic film removal region 25 described above is a portion of the first organic film 50 located in the inorganic film removal region 25. That is, when the first organic film 50 is formed on the side of the inorganic film 20 facing away from the base sub-substrate 10, the organic material for forming the first organic film 50 may also be used for filling each inorganic film removal region 25 in the inorganic film 20 while the first organic film 50 is formed. Optionally, the first organic film 50 covers a part of the surface of the inorganic film 20, thereby protecting the inorganic film 20.

For example, the display substrate is the OLED display substrate. The OLED display substrate includes a buffer film, a gate insulating film, an interlayer insulating film and a planarization (abbreviated as PLN) film that are disposed on the base sub-substrate 10 in sequence and are disposed on top of one another. The materials of the buffer film, the gate insulating film and the interlayer insulating film include at least one of SiNx or SiOx (or a similar inorganic material), and the planarization film is made of an organic material. Therefore, the at least one inorganic film 20 includes the buffer film, the gate insulating film and the interlayer insulating film, and the planarization film is the first organic film 50.

In some examples, portions of the buffer film, the gate insulating film and the interlayer insulating film located in the edge region 432 are all removed. That is, inorganic film removal regions 25 of the three films located in the edge region 432 communicates with one another and form an entire opening, and the opening is filled with a portion of the planarization layer located in the edge region 432.

It will be noted that the impact toughness of the material of the first organic film 50 is greater than the impact toughness of the material of the inorganic film 20. For example, the first organic film 50 is made of PI.

In some embodiments, a part of the material for forming the first organic film 50 disposed on a side of the at least one inorganic film 20 facing away from the base sub-substrate 10 may also be used for filling inorganic film removal regions 25 in the at least one inorganic film 20, thereby eliminating a need to separately fill each inorganic film removal region 25 in the at least one inorganic film 20 with the organic material, and simplifying a process of manufacturing the display substrate.

Figure 14:
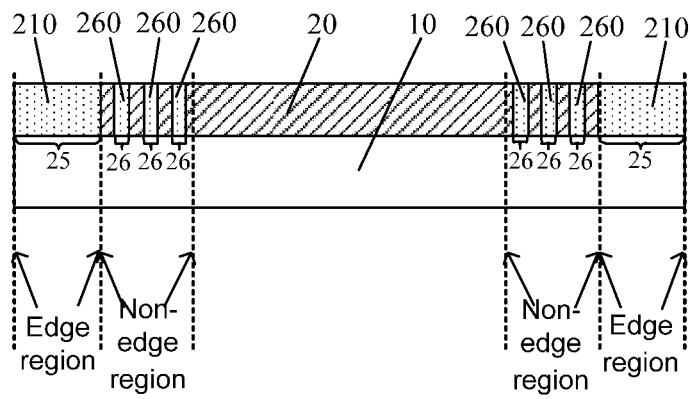
FIG. 14 is a cross-section diagram of yet another display substrate taken along line B-B' shown in FIG. 10, in accordance with some embodiments.

In some embodiments, as shown in FIG. 14, a portion of each inorganic film 20 located in the non-edge region 431 includes at least one slit 260. The display substrate further includes a fourth organic material 260 filled in each slit 26. In some examples, the non-edge region 431 circles the display region 41, and each slit 26 in the non-edge region 431 circles the display region 41. That is, each slit 26 is in an annular rectangular shape. For example, as shown in FIGS. 10 and 14, each slit 26 includes four strip-shaped slits connected in sequence. In some examples, the at least one slit 26 of each inorganic film 20 located in the non-edge region 431 includes a single slit 26. In some other examples, the at least one slit 26 of each inorganic film 20 located in the non-edge region 431 includes a plurality of slits 26, and an outer slit 26 of the plurality of slits 26 surrounds an inner slit 26 of the plurality of slits 26. In some other examples, each of at least one slits 26 of the plurality of slits is filled with the fourth organic material 260. It will be noted that the shape of the slit 26 will not be limited to the annular rectangular shape, and can be set according to actual needs. For example, the slit 26 is in a semi-annular shape.

In some examples, the fourth organic material 260, the third organic material 240, the second organic material 230 and the first organic material 210 are the same material.

Since the impact toughness of the fourth organic material 260 is relatively high, the inorganic film 20 in the display substrate may be further protected by filling the fourth organic material 260 in each slit 26 of the non-edge region 431. That is, the fourth organic material 260 filled in each slit 26 cooperates with the first organic material 210 filled in each inorganic film removal region 25, which may prevent the edge cracks of the inorganic film 20 due to collision, pressing, bending or the like, and may also effectively prevent the edge cracks of the inorganic film 20 from extending to the display region 41 in the case of the edge cracks of the inorganic film 20.

In addition, inorganic film removal regions 25 disposed in a strip shape in the at least one inorganic film 20, slits 26 and the organic material filled in each slit 26 may also be used for well dissipating heat from the non-display region 43 of the display substrate.

In some embodiments, the at least one inorganic film 20 includes a plurality of inorganic films 20 (such as the buffer film, the gate insulating film and the interlayer insulating film). A portion of each inorganic film 20 located in each edge region 432 is provided with at least one inorganic film removal region 25. Inorganic film removal regions 25 of the plurality of inorganic films 20 located in a same region communicate with one another in a direction perpendicular to the base sub-substrate 10. That is, when the plurality of inorganic films 20 are as a whole, the inorganic film removal regions 25 of the plurality of inorganic films 20 located in a same region communicate with one another and pass through the plurality of inorganic films 20.

It will be noted that in the case where the at least one inorganic film 20 includes the plurality of inorganic films 20, the plurality of inorganic films 20 are stacked on top of each other, and each adjacent two inorganic films are in direct contact or spaced apart, which some embodiments of the present disclosure do not limit.

In some embodiments, each adjacent two inorganic films 20 are in direct contact, and the inorganic film removal regions 25 in at least two inorganic films 20 are disposed in the same manner. That is, an orthographic projection of each inorganic film removal region 25 in the at least two inorganic film 20 on the base sub-substrate 10 overlaps with an orthographic projection of a corresponding inorganic film removal region 25 in an adjacent inorganic film 20 on the base sub-substrate 10. In this way, the inorganic film removal regions 25 may be formed in the at least two inorganic films 20 through the same patterning process, which is advantageous for simplifying the process of manufacturing the display substrate.

The portion of each inorganic film 20 located in the edge region 432 is provided with at least one inorganic film removal region 25, and each inorganic film removal region 25 is filled with the first organic material 210, which may prevent the edge cracks of any inorganic film 20 of the plurality of inorganic films 20 due to collision, pressing, bending or the like.

Figure 15:
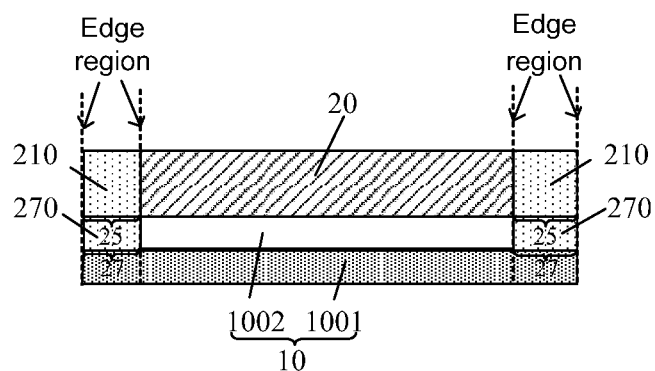
FIG. 15 is a cross-section diagram of yet another display substrate taken along line B-B' shown in FIG. 10, in accordance with some embodiments.
Figure 16:
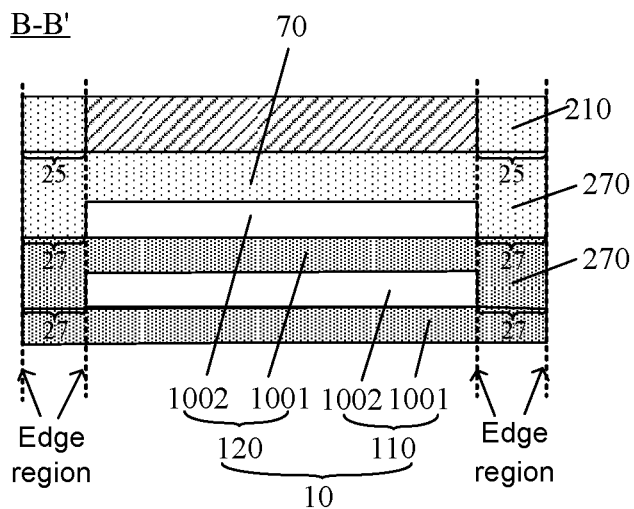
FIG. 16 is a cross-section diagram of yet another display substrate taken along line B-B' shown in FIG. 10, in accordance with some embodiments.

In some embodiments, with reference to FIGS. 15 and 16, the base sub-substrate 10 includes at least one flexible sub-base, and each flexible sub-base includes an organic material film 1001 and a barrier film 1002 disposed on a side of the organic material film 1001 adjacent to the at least one inorganic film 20. A portion of each of at least one barrier film 1002 of the at least one flexible sub-base located in each edge region 432 is provided with at least one third opening 27. The display substrate further includes a fifth organic material 270 filled in each third opening 27.

In some examples, the organic material film 1001 is made of an organic material such as PI, and the barrier film 1002 is made of an inorganic material such as SiOx. In some embodiments, the barrier film 1002 made of an inorganic material is provided with third openings 27, and each third opening 27 is filled with the fifth organic material 270, which may effectively prevent the edge cracks of the base sub-substrate 10 of the display substrate due to collision, pressing, bending or the like. In some examples, the fifth organic material 270, the fourth organic material 260, the third organic material 240, the second organic material 230 and the first organic material 210 are the same material.

In some embodiments, with reference to FIG. 16, the at least one flexible sub-base includes N flexible sub-bases stacked on top of one another, N is greater than or equal to 2, and N is an integer. A (n+1)th flexible sub-base is disposed on a side of a nth flexible sub-base adjacent to the at least one inorganic film 20, n is greater than or equal to 1 and is less than or equal to (N−1), and n is an integer. The fifth organic material 270 filled in each third opening 27 of the nth flexible sub-base is a portion of the organic material film 1001 of the (n+1)th flexible sub-base located in the third opening 27 of the nth flexible sub-base.

In some embodiments, with continued reference to FIG. 16, the display substrate further includes a second organic film 70 disposed between a Nth flexible sub-base and the at least one inorganic film 20. The fifth organic material 270 filled in each third opening 27 of the Nth flexible sub-base is a portion of the second organic film 70 located in the third opening 27 of the Nth flexible sub-base.

For example, as shown in FIG. 16, the base sub-substrate 10 includes two flexible sub-bases stacked on top of one another, which are the first flexible sub-base 110 and the second flexible sub-base 120, respectively. The second flexible sub-base 120 is disposed on a surface of the first flexible sub-bases 110 adjacent to the at least one inorganic film 20. A part of the organic material film 1001 of the second flexible sub-base 120 is filled in third openings 27 of the barrier film 1002 of the first flexible sub-base 110. In the case where the display substrate further includes the second organic film 70 disposed on a surface of the barrier film 1002 of the second flexible sub-base 120 facing away from the first flexible sub-base 110 of the second flexible sub-base 120, a part of the second organic film 70 is filled in third openings 27 of the barrier film 1002 of the second flexible sub-base 120.

The fact that a part of the organic material film 1001 of the second flexible sub-base 120 is filled in the third openings 27 of the barrier film 1002 of the first flexible sub-base 110 described above means that when the organic material film 1001 of the second flexible sub-base 120 is formed on a surface of the barrier film 1002 of the first flexible sub-base 110 facing away from the organic material film 1001 of the first flexible sub-base 110, the organic material for fabricating the organic material film 1001 of the second flexible sub-base 120 may also be used for filling third openings 27 of the barrier film 1002 of the first flexible sub-base 110 while the organic material film 1001 of the second flexible sub-base 120 is formed. The fact that a part of the second organic film 7 is filled in the third openings 27 of the barrier film 1002 of the second flexible sub-base 120 means that when the second organic film 7 is formed on a surface of the barrier film 1002 of the second flexible sub-base 120 facing away from the organic material film 1001 of the second flexible sub-base 120, the organic material for fabricating the second organic film 70 may be used for filling the third openings 27 of the barrier film 1002 of the second flexible sub-base 120 while the second organic film 70 is formed.

As will be seen from the above, a part of the organic material film 1001 of the second flexible sub-base 120 is used for filling the third openings 27 of the barrier film 1002 of the first flexible sub-base 110, and a part of the second organic film 70 is used for filling the third openings 27 of the barrier film 1002 of the second flexible sub-base 120, which may effectively simplify the process of manufacturing the display substrate.

In some examples, the second organic film 70 is made of an organic material, such as PI. In some examples, the material for fabricating the second organic film 70 is the same as or different from the material for fabricating the organic material film 1001 of the second flexible sub-bases 120.

It will be understood that if the inorganic film 20 is directly formed on the surface of the barrier film 1002 of the base sub-substrate 10, the inorganic film removal regions 25 in the inorganic film 20 and the third openings 27 in the barrier film 1002 may be disposed in the same manner, for example, as shown in FIG. 16, so that the inorganic film removal regions 25 in the inorganic film 20 and the third openings 27 in the barrier film 1002 may be filled with the organic material through the same process. On this basis, if the second organic film 70 is provided in the display substrate, the second organic film 70 may be disposed on a side of the at least one inorganic film 20 away from the base sub-substrate 10, so that a part of the material for fabricating the second organic film 70 may be used for filling the third openings 27 in the barrier film 1002 and the inorganic film removal regions 25 in the at least one inorganic film 20. That is, the second organic film 70 herein has the same function as the first organic film 50 in the embodiments described above, and both may be the same organic film.

Figure 17:
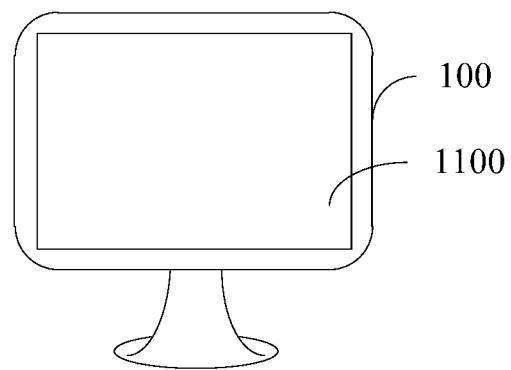
FIG. 17 is a schematic diagram showing a structure of a display device, in accordance with some embodiments.

Some embodiments of the present disclosure provide a display device. As shown in FIG. 17, the display device 100 includes the display substrate 1100 according to any embodiment of the embodiments described above. In some examples, the display device 100 is a display panel or a display including a display panel. The display device provided by some embodiments of the present disclosure has same effects as the display substrate described above, which are not described herein again.

In the description of the above embodiments, specific features, structures, materials or characteristics may be combined in any suitable manner in any one or more embodiments or examples.

The foregoing descriptions are merely some implementation manners of the present disclosure, but the protection scope of the present disclosure is not limited thereto. Any person skilled in the art could readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. A display substrate motherboard, having at least one display region and a peripheral region disposed at a periphery of the at least one display region, the peripheral region including cutting regions,
    the display substrate motherboard comprising:
    a base substrate; and
    at least one inorganic film layer disposed on a side of the base substrate, wherein each inorganic film layer includes at least one first opening located in each cutting region; and
    a first organic material filed in each first opening;
    wherein the base substrate includes at least one flexible base, and each flexible base includes an organic material layer and a barrier layer disposed on a side of the organic material layer adjacent to the at least one inorganic film layer; and a portion of each barrier layer of the at least one flexible base located in each cutting region includes at least one second opening, and the display substrate motherboard further includes a third organic material filled in each second opening;
    wherein the at least one flexible base includes N flexible bases stacked on top of one another, N is greater than or equal to 2, and N is an integer; and a (n+1)th flexible base is disposed on a side of a nth flexible base adjacent to the at least one inorganic film layer, n is greater than or equal to 1 and is less than or equal to (N−1), and n is an integer; and the third organic material filled in each second opening of the nth flexible base is a portion of an organic material layer of the (n+1)th flexible base located in the second opening of the nth flexible base.

2. The display substrate motherboard according to claim 1, further comprising a first organic film layer disposed on a side of the at least one inorganic film layer facing away from the base substrate; and
    the first organic material filled in each first opening is a portion of the first organic film layer located in the first opening.

3. The display substrate motherboard according to claim 1, wherein the peripheral region further includes at least one non-cutting region,
    a portion of each inorganic film layer located in each non-cutting region includes at least one slit, and the display substrate motherboard further includes a second organic material filled in each slit.

4. The display substrate motherboard according to claim 1, wherein
    the at least one first opening of each inorganic film layer located in each cutting region includes a plurality of first openings, and each first opening is a strip-shaped opening; or the at least one first opening of each inorganic film layer located in each cutting region includes a single first opening, and an orthographic projection of the first opening on the base substrate coincides with an orthographic projection of the cutting region on the base substrate.

5. The display substrate motherboard according to claim 1, wherein the at least one inorganic film layer includes a plurality of inorganic film layers, and first openings of the plurality of inorganic film layers located in a same region communicate with one another in a diretion perpendicular to the base substrate.

6. The display substrate motherboard according to claim 1, wherein the at least one flexible base includes N flexible bases stacked on top of one another, N is greater than or equal to 2, and N is an integer; and the display substrate motherboard further comprises a second organic film layer disposed on a side of a Nth flexible base adjacent to the at least one inorganic film layer; and the third organic material filled in each second opening of the Nth flexible base is a portion of the second organic film layer located in the second opening of the Nth flexible base.

7. A display substrate, having a display region and a non-display region disposed at a periphery of the display region, the non-display region including edge regions, the display substrate comprising:

a base sub-substrate; and at least one inorganic film disposed on a side of the base sub-substrate, wherein each inorganic film includes at least one inorganic film removal region located in each edge region; and a first organic material filed in each inorganic film removal region;

wherein the base sub-substrate includes at least one flexible sub-base, and each flexible sub-base includes an organic material film and a barrier film disposed on a side of the organic material film adjacent to the at least one inorganic film; and a portion of each barrier film of the at least one flexible sub-base located in each edge region includes at least one third opening, and the display substrate further includes a fifth organic material filled in each third opening;

wherein the at least one flexible sub-base includes N flexible sub-bases stacked on top of one another, N is greater than or equal to 2, and N is an integer; and a (n+1)th flexible sub-base is disposed on a side of a nth flexible sub-base adjacent to the at least one inorganic film, n is greater than or equal to 1 and is less than or equal to (N−1), and n is an integer; and the fifth organic material filled in each third opening of the nth flexible sub-base is a portion of an organic material film of the (n+1)th flexible sub-base located in the third opening of the nth flexible sub-base.

8. The display substrate according to claim 7, further comprising a first organic film disposed on a side of the at least one inorganic film facing away from the base sub-substrate; and the first organic material filled in each inorganic film removal region is a portion of the first organic film located in the inorganic film removal region.

9. The display substrate according to claim 7, wherein the non-display region further includes a non-edge region, a portion of each inorganic film located in the non-edge region includes at least one slit, and the display substrate further includes a fourth organic material filed in each slit.

10. The display substrate according to claim 7, wherein the at least one inorganic film removal region of each inorganic film in each edge region includes a plurality of inorganic film removal regions, and each inorganic film removal region is disposed in a strip shape; or the at least one inorganic film removal region of each inorganic film in each edge region includes a single inorganic film removal region, and an orthographic projection of the inorganic film removal region on the base sub-substrate coincides with an orthographic projection of the edge region on the base sub-substrate.

11. The display substrate according to claim 7, wherein the at least one inorganic film includes a plurality of inorganic films, and inorganic film removal regions of the plurality of inorganic films located in a region communicate with one another in a direction perpendicular to the base sub-substrate.

12. The display substrate according to claim 7, wherein the at least one flexible sub-base includes N flexible sub-bases stacked on top of one another, Nis greater than or equal to 2, and N is an integer; and the display substrate further comprises a second organic film disposed on a side of a Nth flexible sub-base adjacent to the at least one inorganic film; and the fifth organic material filled in each third opening of the Nth flexible sub-base is a portion of the second organic film located in the third opening of the Nth flexible sub-base.

13. A display device, comprising the display substrate according to claim 7.

* * * * *